(12) United States Patent
Avraham et al.

(10) Patent No.: US 11,733,876 B2
(45) Date of Patent: Aug. 22, 2023

(54) CONTENT AWARE DECODING IN KV DEVICES

(71) Applicant: Western Digital Technologies, Inc., San Jose, CA (US)

(72) Inventors: David Avraham, Even Yehuda (IL); Alexander Bazarsky, Holon (IL); Ran Zamir, Ramat Gan (IL)

(73) Assignee: Western Digital Technologies, Inc., San Jose, CA (US)

(*) Notice: Subject to any disclaimer, the term of this patent is extended or adjusted under 35 U.S.C. 154(b) by 88 days.

(21) Appl. No.: 17/569,356

(22) Filed: Jan. 5, 2022

(65) Prior Publication Data

US 2023/0214129 A1    Jul. 6, 2023

(51) Int. Cl.
*G06F 12/00* (2006.01)
*G06F 3/06* (2006.01)
*H03M 13/11* (2006.01)

(52) U.S. Cl.
CPC .......... *G06F 3/0619* (2013.01); *G06F 3/0659* (2013.01); *G06F 3/0673* (2013.01); *H03M 13/1145* (2013.01)

(58) Field of Classification Search
None
See application file for complete search history.

(56) References Cited

U.S. PATENT DOCUMENTS

| | | |
|---|---|---|
| 7,882,300 B2 | 2/2011 | Kim et al. |
| 8,327,226 B2 | 12/2012 | Rub |
| 8,418,021 B2 | 4/2013 | Lin et al. |
| 8,650,458 B2 | 2/2014 | Kim et al. |
| 9,075,710 B2 | 7/2015 | Talagala et al. |
| 9,214,963 B1 | 12/2015 | Garani et al. |
| 9,317,362 B2 | 4/2016 | Khan |
| 9,619,381 B2 | 4/2017 | Camp et al. |
| 9,654,141 B2 | 5/2017 | Radke |
| 9,959,067 B2 | 5/2018 | Yang et al. |
| 10,073,732 B2 | 9/2018 | Lee et al. |
| 10,284,231 B2 | 5/2019 | Canepa |

(Continued)

FOREIGN PATENT DOCUMENTS

WO    2021162734 A1    8/2021

OTHER PUBLICATIONS

Kim, et al., The Key to Value: Understanding the NVMe Key-Value Standard, Live Website, Sep. 1, 2020, SNIA NSF, Networking Storage, 31 pp.

(Continued)

*Primary Examiner* — Daniel D Tsui
(74) *Attorney, Agent, or Firm* — Patterson + Sheridan, LLP; Steven H. VerSteeg

(57) ABSTRACT

A data storage device includes a memory device and a controller coupled to the memory device. The controller is configured to store a plurality of codewords in the memory device. Each codeword of the plurality of codewords includes host data and parity data corresponding to the host data. Less than all of the plurality of codewords further includes statistics corresponding to the host data. Each statistic of the plurality of codewords is the same or different as another statistic of the plurality of codewords. The statistics are either incremental statistics, adaptive statistics, or both incremental statistics and adaptive statistics.

20 Claims, 8 Drawing Sheets

(56) References Cited

U.S. PATENT DOCUMENTS

| | | | |
|---|---|---|---|
| 10,693,501 B2 | 6/2020 | Park et al. | |
| 10,735,031 B2 | 8/2020 | Avraham et al. | |
| 10,770,168 B2 | 9/2020 | Cadloni et al. | |
| 10,795,760 B2 | 10/2020 | Ki | |
| 11,138,234 B2* | 10/2021 | Varakin | G06F 16/1858 |
| 11,265,011 B2* | 3/2022 | Szczepanek | H03M 13/158 |
| 2003/0043749 A1 | 3/2003 | Tanaka et al. | |
| 2007/0271493 A1 | 11/2007 | Oh et al. | |
| 2013/0024746 A1 | 1/2013 | Sharon et al. | |
| 2013/0086224 A1 | 4/2013 | Teraguchi | |
| 2013/0250686 A1 | 9/2013 | Marukame et al. | |
| 2014/0136927 A1 | 5/2014 | Li et al. | |
| 2014/0153654 A1 | 6/2014 | Vojcic et al. | |
| 2015/0003169 A1 | 1/2015 | Nam et al. | |
| 2016/0041783 A1 | 2/2016 | Choi et al. | |
| 2016/0342467 A1 | 11/2016 | Kumar et al. | |
| 2018/0358989 A1 | 12/2018 | Mehra et al. | |
| 2019/0258543 A1 | 8/2019 | Park | |
| 2020/0007158 A1 | 1/2020 | Cooper et al. | |
| 2020/0019458 A1* | 1/2020 | Cadloni | G11C 29/44 |
| 2020/0127685 A1 | 4/2020 | Chen et al. | |
| 2020/0225882 A1 | 7/2020 | Li | |
| 2020/0226065 A1 | 7/2020 | Yang et al. | |
| 2020/0235757 A1 | 7/2020 | Achtenberg et al. | |
| 2020/0301850 A1 | 9/2020 | Qiu et al. | |
| 2020/0301899 A1 | 9/2020 | Tu et al. | |
| 2021/0055886 A1 | 2/2021 | Twitto et al. | |
| 2021/0089391 A1 | 3/2021 | Kuribara | |
| 2021/0157746 A1 | 5/2021 | Lee et al. | |
| 2021/0191882 A1 | 6/2021 | Lee et al. | |
| 2021/0218421 A1 | 7/2021 | Fainzilber et al. | |
| 2022/0004336 A1* | 1/2022 | Naghate | G11C 16/32 |
| 2022/0147440 A1 | 5/2022 | Benisty et al. | |

OTHER PUBLICATIONS

Adams, NVMe® Base Specification 2.0 Preview, Flash Memory Summit, 2020, NVM Express organization, 20 pp.

Samsung Key Value SSD Enables High Performance Scaling, A Technology Brief by Samsung Memory Solutions Lab, Samsung Electronics, Co. Ltd., 2017, 8 pp.

Pitchumani, et al., Hybrid Data Reliability for Emerging Key-Value Storage Devices, USENIX Association, 18th USENIX Conference on File and Storage Technologies, Feb. 2020, 15 pp.

Chen, et al., KVFTL: Optimization of Storage Space Utilization for Key-Value-Specific Flash Storage Devices, 2017 22nd Asia and South Pacific Design Automation Conference (ASP-DAC), 7 pp.

Martin, et al, NVM Express Technical Proposal for New Feature, Jun. 2020, NVM Express, Inc., 34 pp.

International Search Report and Written Opinion for International Application No. PCT/US2022/029546 dated Oct. 21, 2022.

International Search Report and Written Opinion for International Application No. PCT/US2022/029509 dated Sep. 23, 2022.

International Search Report and Written Opinion for International Application No. PCT/US2022/029547 dated Oct. 11, 2022.

\* cited by examiner

CONTENT AWARE DECODING IN KV DEVICES

BACKGROUND OF THE DISCLOSURE

Field of the Disclosure

Embodiments of the present disclosure generally relate to data storage devices, such as solid state drives (SSDs), and, more specifically, storing key value (KV) pair data in a data storage device.

Description of the Related Art

A KV database works by storing a quantity of user data that is associated with a key that is addressable as a complete entity. Examples of user data that can be stored in a KV database may include photos, records, and files. From a host device point-of-view, the photo, the record, or the file may be retrieved using a single key/address, rather than using multiple addresses that includes data of the photo, the record, or the file. The data is stored as unstructured data and may be addressed using a key of variable length. Storage space of a memory device may be allocated for KV pair data in increments of bytes, where a length value of the KV pair data is associated with the necessary storage space to store the KV pair data.

Using a KV database in a data storage device may increase the performance of the data storage device. For example, the number of data transfers/second may be improved because the KV pair data to physical storage location translation layer in the host device may be removed. Furthermore, the number of commands over the bus may be reduced since an entire KV pair data may utilize a single transfer. KV pair data allows access to data on a controller using a key rather than a block address. By providing a key to store a corresponding value on a memory device, the value may be retrieved from the memory device using the corresponding key. Because KV pair data is associated with host data that corresponds to objects in higher data hierarchy (e.g., journaling, data tables, padded areas, etc.) and is read sequentially, content aware decoding may increase the performance of KV systems.

Therefore, there is a need in the art for data storage device having a KV system that supports content aware decoding.

SUMMARY OF THE DISCLOSURE

The present disclosure generally relates to data storage devices, such as solid state drives (SSDs), and, more specifically, using key value (KV) pair data with content aware decoding data in a data storage device. A data storage device includes a memory device and a controller coupled to the memory device. The controller is configured to store a plurality of codewords in the memory device. Each codeword of the plurality of codewords includes host data and parity data corresponding to the host data. Less than all of the plurality of codewords further includes statistics corresponding to the host data. Each statistic of the plurality of codewords is the same or different as another statistic of the plurality of codewords. The statistics are either incremental statistics, adaptive statistics, or both incremental statistics and adaptive statistics.

In one embodiment, a data storage device includes a memory device and a controller coupled to the memory device. The controller is configured to store a plurality of codewords in the memory device. Each codeword of the plurality of codewords includes host data and parity data corresponding to the host data. Less than all of the plurality of codewords further includes statistics corresponding to the host data.

In another embodiment, a data storage device includes a memory device and a controller coupled to the memory device. The controller is configured to program a plurality of codewords to the memory device. The plurality of codewords includes a first codeword, a second codeword, and a third codeword. The first codeword includes first statistics, the second codeword includes second statistics, and the third codeword includes third statistics. The first statistics, the second statistics, and the third statistics are different.

In another embodiment, a data storage device includes memory means and a controller coupled to the memory means. The controller is configured to program a plurality of codewords to the memory means. Less than all codewords of the plurality of codewords contains statistics corresponding to all of the plurality of codewords.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to data storage devices, such as solid state drives (SSDs), and, more specifically, storing key value (KV) pair data with content aware decoding data in a data storage device. A data storage device includes a memory device and a controller coupled to the memory device. The controller is configured to store a plurality of codewords in the memory device. Each codeword of the plurality of codewords includes host data and parity data corresponding to the host data. Less than all of the plurality of codewords further includes statistics corresponding to the host data. Each statistic of the plurality of codewords is the same or different as another statistic of the plurality of codewords. The statistics are either incremental statistics, adaptive statistics, or both incremental statistics and adaptive statistics.

Figure 1:
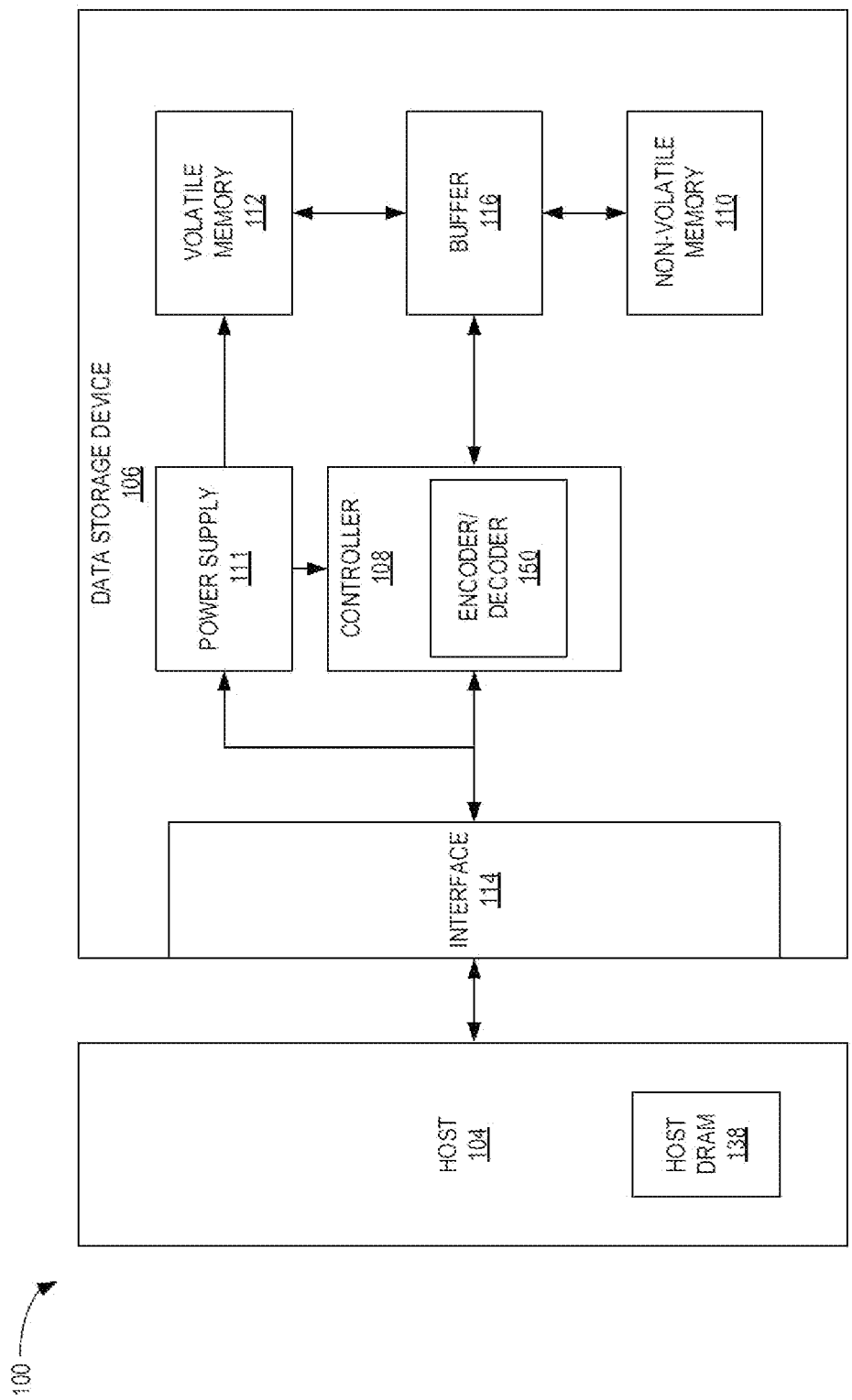
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

The controller 108 includes an encoder/decoder unit 150. The encoder/decoder unit 150 may be separate components, such that the controller 108 includes an encoder unit and a decoder unit. Furthermore, the encoder/decoder unit 150 may be coupled to the controller 108, where the encoder/decoder unit 150 is external to the controller 108. The encoder of the encoder/decoder unit 150 may be configured to encode received host data with error correction code (ECC) in order to protect the received host data from bit errors and/or to correct bit errors. The decoder of the encoder/decoder unit 150 may be configured to determine if the host data read from the NVM 110 includes bit errors and correct bit errors. The decoder decodes the host data read from the NVM 110 so that the host device 104 may be able to read the data. In some embodiments, the decoder is a content aware decoder or an iterative content aware decoder.

KV pair data stores host data, which corresponds to objects in a higher data hierarchy, such that the KV pair data may have inherent structures (e.g., journaling, data tables, padded areas. etc.). Because bits in data may be statistically dependent on another bit, content aware decoders may use pattern recognition to improve decoding performance. For example, in a text file, bits are organized in bytes, where each byte represents a character. The most used characters in the text file may be alphanumeric, spaces, and/or punctuation marks. Therefore, bits from the same byte may be statistically dependent. By knowing at least a portion of the bits within a byte, the decoding performance of the content aware decoder may be increased due to the recognition of the statistics of the byte.

KV pair data includes a key and a value, where the data of the value is addressed by the key. The key may have a size of about 1 byte to about 64 bytes and the value may have a size of about 0 bytes to about $2^{32}$-1 bytes. For example, a value having a size of about 0 bytes is an empty value. It is to be understood that the previously mentioned values are not intended to be limiting, but to provide an example of an embodiment. A KV system may include a command set that includes, in a non-limiting list, a delete command, a list command, a retrieve command, an exist command, and a store command.

The delete command may cause the controller 108 to delete the key and value associated with a specified key. The list command may cause the controller 108 to list keys that exist in a KV namespace starting at a specified key. The exist command may cause the controller 108 to return a status indicating whether a KV exists for a specified key to the command generator, such as the host device 104. The store command may cause the controller 108 to store a KV to a KV namespace.

The retrieve command may cause the controller 108 to retrieve the value associated with a specified key from a KV namespace. The length to be retrieved of the KV pair data is specified in the retrieve command and the location to transfer the KV pair data is specified by either a scatter gather list (SGL) pointer or a physical region page (PRP) pointer in the retrieve command. If the specified length in the retrieve command is less than the length of the KV pair data that is being retrieved, then the controller 108 returns the requested amount and the length of the KV pair data to the completion queue. However, if the specified length in the retrieve command is greater than the length of the KV pair data that is being retrieved, then the controller 108 returns the data from the NVM 110 and the length of that KV pair data is returned to the completion queue.

Figure 2:
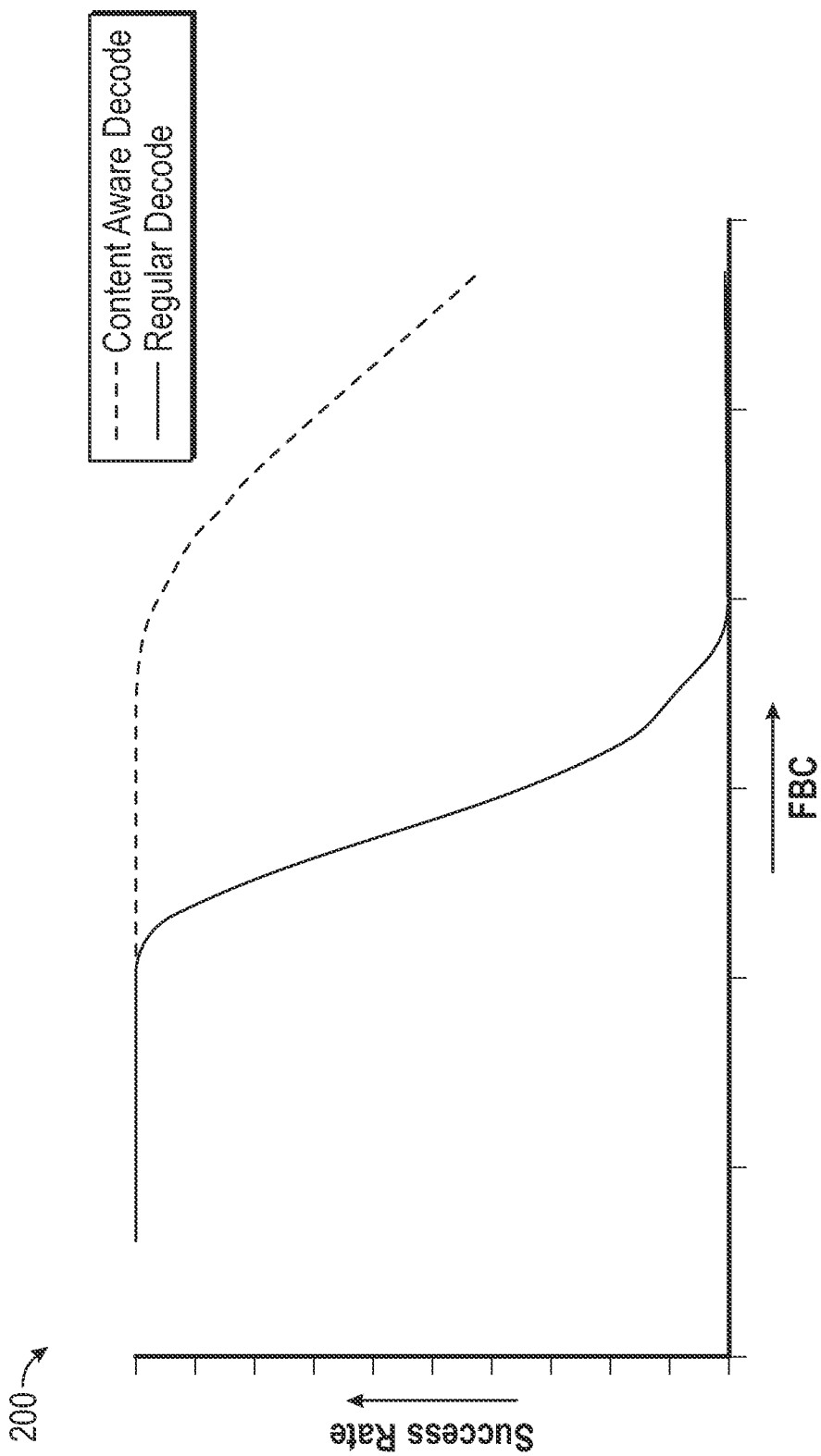
FIG. 2 is a graph illustrating an enhancement of correction capability by using a content aware decoder, according to certain embodiments.

FIG. 2 is a graph 200 illustrating an enhancement of correction capability by using a content aware decoder, which may be the decoder of the encoder/decoder unit 150, according to certain embodiments. Graph 200 illustrates a success rate of decoding vs the number of bit flips in data chunks. The x-axis corresponds to the number of bit flips in a data chunk and the y-axis corresponds to a decode success rate out of 128 data chunks from a sequential read. The "regular decode" curve corresponds to the default decoder, without any knowledge of the underlying statistics. The "content aware decode" curve utilizes the underlying structure and corresponds to the content aware decoding methods, where the underlying statistics where estimated in an iterative manner. In this example, a content aware decoder may handle about twice the amount of BERs that a regular decoder can. At the point where the default decoder cannot decode at all, the enhanced decoder still maintains almost 100% of successful decoding.

Figure 3:
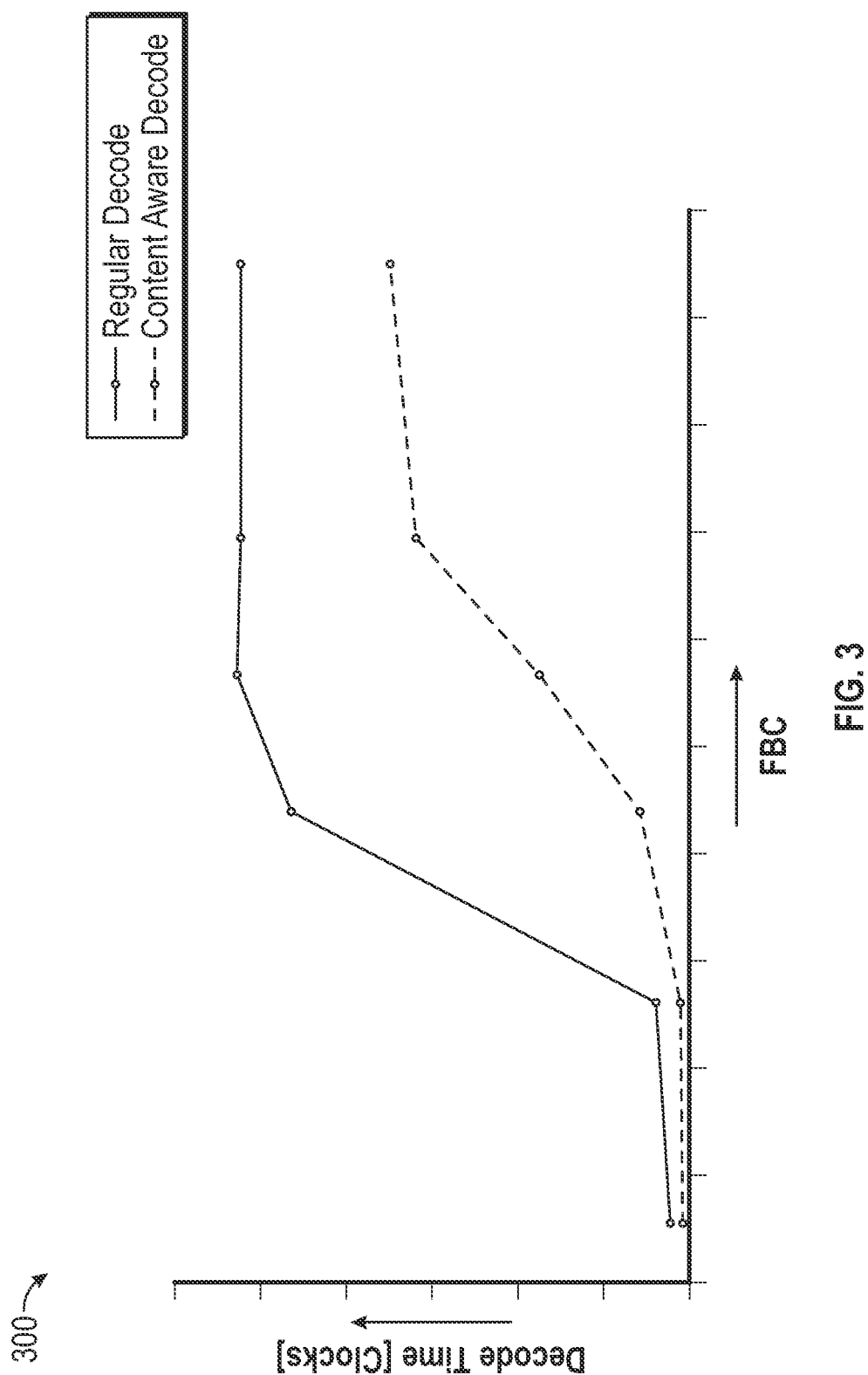
FIG. 3 is a graph illustrating a reduction of decoding latency by using a content aware decoder, according to certain embodiments.

FIG. 3 is a graph 300 illustrating a reduction of decoding latency by using a content aware decoder, which may be the decoder of the encoder/decoder unit 150, according to certain embodiments. Graph 300 illustrates a decode time vs the number of flipped bits in data chunks. The x-axis corresponds to a number of bit flips in a data chunk and the y-axis corresponds to an average decoding latency according to 128 data chunks from a sequential read. The "regular decode" curve corresponds to the default decoder, without any knowledge of the underlying statistics. The "content aware decode" curve corresponds to a case where the decoder uses the underlying statistics of the data. Even in the region where both the default decoder and the enhanced decoder decode with 100% success rate, the enhanced decoder converges with lower latency.

Figure 4:
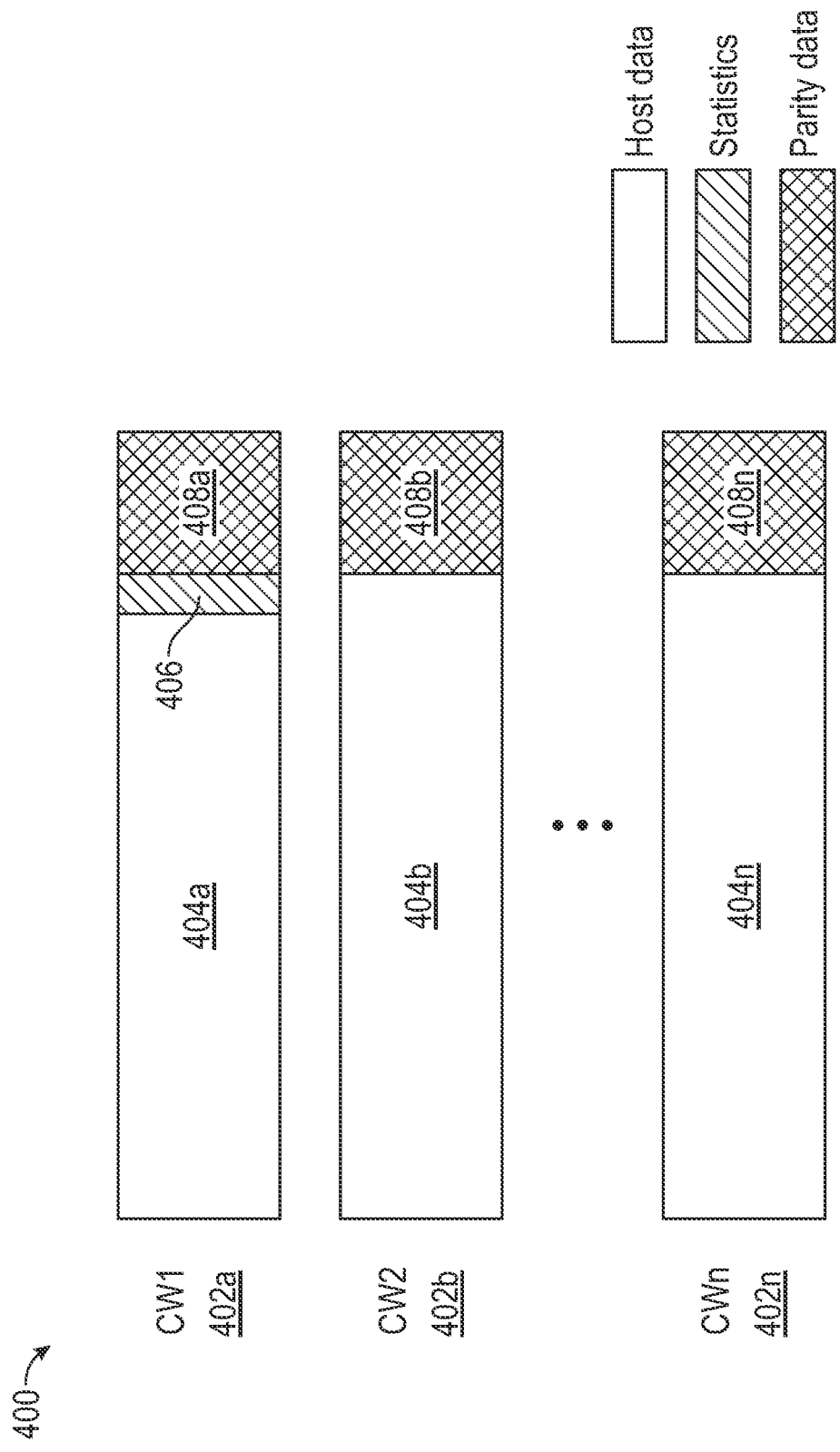
FIG. 4 is an illustration of a plurality of codewords, where a first codeword includes statistics, according to certain embodiments.

FIG. 4 is an illustration of a plurality of codewords 402a-402n, where a first codeword (CW) 402a includes statistics, according to certain embodiments. For exemplary purposes, aspects of the storage system 100 may be referenced herein. The plurality of codewords 402a-402n may be programmed to a memory device, such as the NVM 110. A codeword includes at least host data and parity data. Host data may refer to data transferred from the host device 104 to the controller 108 to be programmed to the NVM 110. It is to be understood that a codeword may include data generated internally by the data storage device 106. The parity data may be generated by the encoder of the encoder/decoder unit 150 based on the host data. Parity data may be ECC data, such that the corresponding host data may be recovered in cases of high bit errors or bit flips.

In a KV system, data stored to the NVM 110 is long and is read sequentially from a predetermined start point. Furthermore, because there is KV pair data does not have as tight of coupling between the physical block address (PBA) and the logical block address (LBA) of a regular address based system, the KV pair data may be realigned to have intermediate points that hold data statistics. In addition, data that comes from a single object or source may have similar data statistics. Likewise, because the data may be relatively long, the overhead may be averaged over many data segments and will be negligible or observed in data padding. Therefore, data statistics may be interleaved within the data using long ECC codes of a codeword. Furthermore, the data statistics corresponds with the decoded KV pair data. The data statistics may be related to an amount of each bit value, a pattern of bit values, and the like.

In some examples, values of a single object may have similar data statistics from a beginning value to an end value. The value may be described by a single histogram or a normalized histogram. Furthermore, the length of the histogram may be a fraction of the length of the data. For example, a byte value histogram having 256 bins with 256 levels has a length of about 256 bytes, where longer KV pair data may have a length of between about 100 KB to about 4 GB. Furthermore, the amount of overhead allocated to save the data statistics may be adjusted. For example, the data statistics may be adjusted so that a tighter representation for shorter data is maintained. The first CW 402a includes first host data 404a, statistics 406, and first parity data 408a. A second CW 402b includes second host data 404b and second parity data 408b. A nth CW 402n includes nth host data 404n and nth parity data 408n. Because the statistics for values of a single object is relatively similar, the statistics may be stored in a dictionary located on a first FMU which will be decoded for each read operation. For example, the dictionary for all of the plurality of codewords 402a-402n is stored in the statistics 406 of the first CW 402a.

Figure 5:
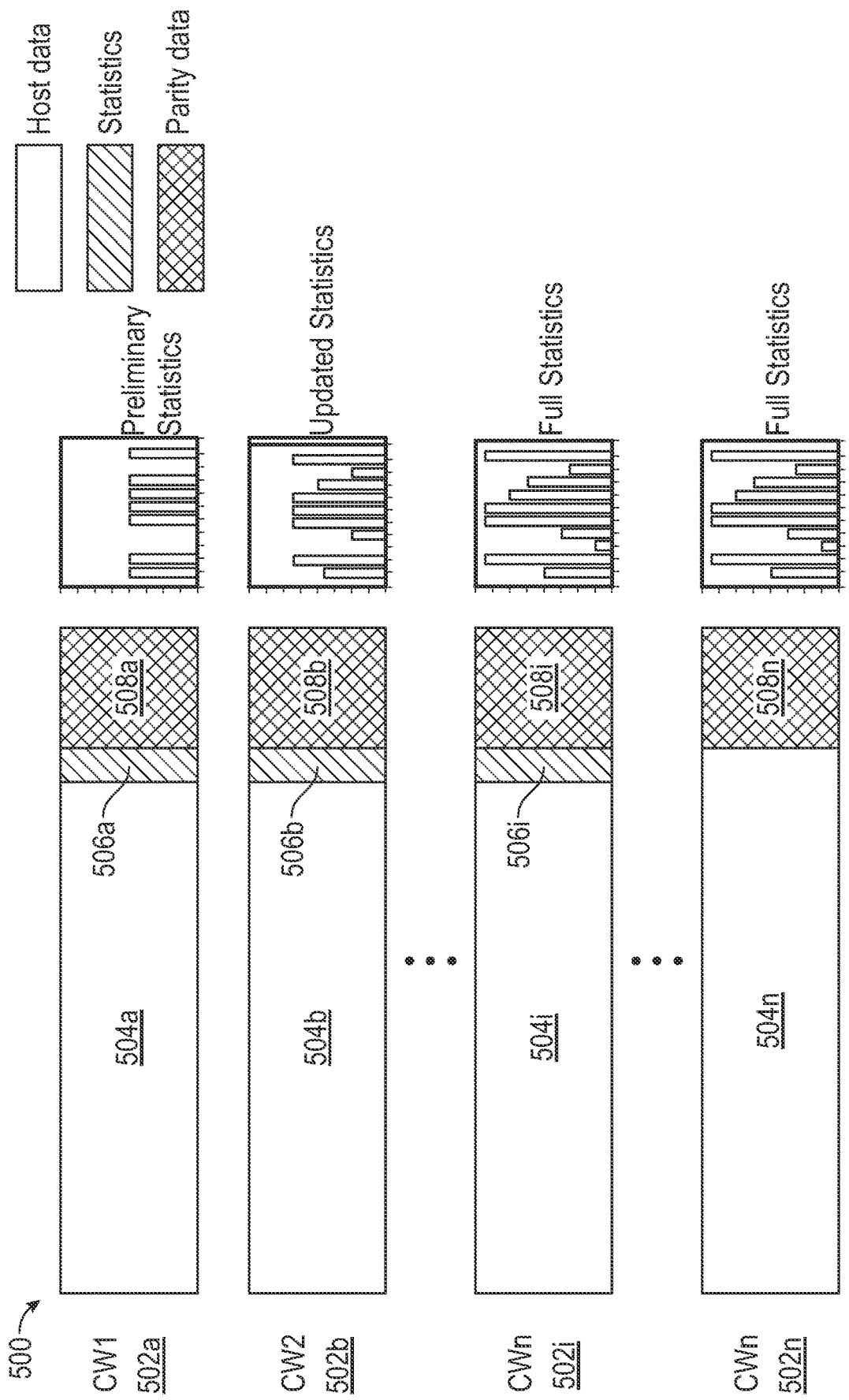
FIG. 5 is an illustration of a plurality of codewords having incremental statistics, according to certain embodiments.

FIG. 5 is an illustration of a plurality of codewords 502a-502n having incremental statistics, according to certain embodiments. For exemplary purposes, aspects of the storage system 100 may be referenced herein. The plurality of codewords 502a-502n may be programmed to a memory device, such as the NVM 110. In order to decrease the amount of overhead in the beginning of the data, as a first CW 502a will be read each time any of the subsequent CWs are read, each subsequent CW may include an incremental addition of a statistic. Thus, over the plurality of codewords 502a-502n, a full representation of the statistics or histogram may be built for the object.

The first CW 502a includes first host data 504a, first statistics 506a, and first parity data 508a. A second CW 502b includes second host data 504b, second statistics 506b, and second parity data 508b. An i-th CW 502i includes i-th host data 504i, i-th statistics 506i, and i-th parity data 508i. A nth CW 502n includes nth host data 504n and nth parity data 508n. The first statistics 506a are preliminary statistics, such that the first statistics 506a describes the statistics of the first CW 502a. The second statistics 506b is an update of the first statistics 506a (i.e., the preliminary statistics).

The updated statistics may be built in a manner that maximizes the information added by each chunk by either passing only the most significant bins in an information maximization scheme or by starting with a small of levels in the histogram and gradually adding levels in order to build a finer representation. In some examples, the updated statistics are an aggregated version of the previous statistics. The i-th statistics 506i of the i-th CW 502i are the full statistics. Therefore, subsequent CWs, such as the nth CW 502n, do not include statistics as reading the i-th CW 502i will have the full representation of the statistics. Thus, the plurality of codewords 502a-502n illustrates how statistics for a KV object or KV pair data are accumulated up to nth CW 502n, where the statistics are built up to the i-th CW 502i, and where the i-th CW 502i to the nth CW 502n do not include any statistics.

Figure 6:
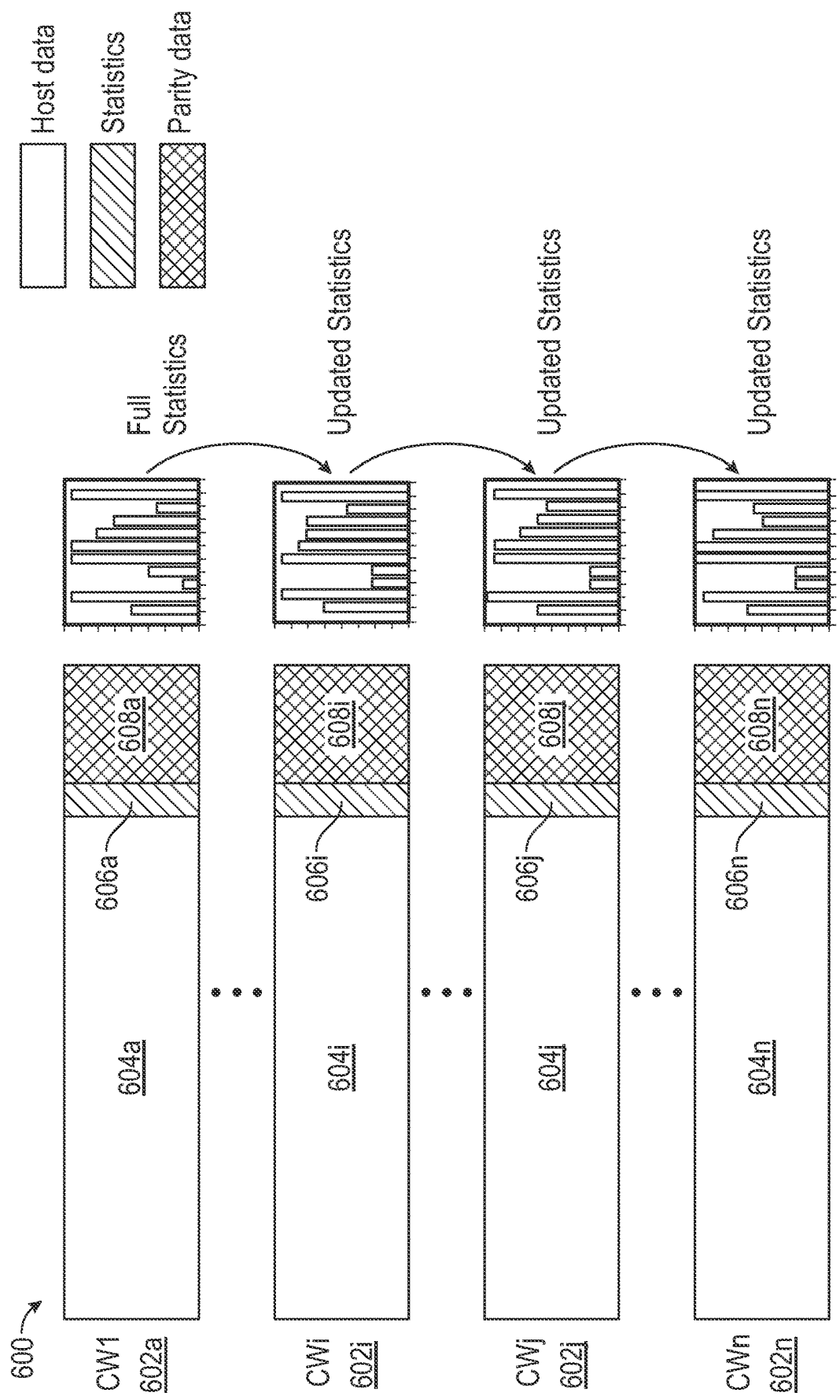
FIG. 6 is an illustration of a plurality of codewords having adaptive statistics, according to certain embodiments.

FIG. 6 is an illustration of a plurality of codewords 602a-602n having adaptive statistics, according to certain embodiments. For exemplary purposes, aspects of the storage system 100 may be referenced herein. The plurality of codewords 602a-602n may be programmed to a memory device, such as the NVM 110. In order to decrease the amount of overhead in the beginning of the data, as a first CW 602a will be read each time any of the subsequent CWs are read, each subsequent CW may include an incremental addition of a statistic. Thus, over the plurality of codewords 602a-602n, a full representation of the statistics or histogram may be built for the object.

The plurality of codewords 602a-602n includes a first CW 602a, an i-th CW 602i, a j-th CW 602j, and an nth CW 602n. The first CW 602a includes first host data 604a, first statistics 606a, and first parity data 608a. The i-th CW 602i includes i-th data host 604i, i-th statistics 606i, and i-th parity data 608i. The j-th CW 602j includes j-th host data 604*j*, j-th statistics 606*j*, and j-th parity data 608*j*. The nth CW 602*n* includes nth host data 604*n*, nth statistics 606*n*, and nth parity data 608*n*.

Although the data may have global statistics, there may be local statistics, especially if the data is very long. Another challenge is, as the full data statistics are not known until all the data is parsed, there may be a need to encode all of the data before writing it to the NVM 110, which may not be feasible if the data is very long (e.g. 4 GB). If the data is assumed to be homogenous, then collecting sufficient statistics from the beginning of the data will be enough to represent all of the data. However, if the data is less homogenous, then the representative statistics may be inaccurate.

The mitigation for these mismatches or the inaccuracies may come from a comparison between the saved data statistics and an estimated version taken from the data itself. As the BER level in the NVM 110 is relatively low and is assumed to be randomly distributed, a histogram built from the data may be a good approximation of the data statistics. Thus, if such a histogram is maintained by the decoder of the encoder/decoder unit 150 (in a windowed manner), the histogram may be compared to the saved stats. If there is a mismatch between the estimated data and saved data, then the estimated data may be used instead of the saved data.

Another way to adjust for miss-representation of the statistics due to locality and/or to accommodate for a short data pipeline in the encoder of the encoder/decoder unit 150 is to continuously adapt the statistics due to changes in the data. The encoder of the encoder/decoder unit 150 holds initial statistics (e.g., first statistics 606*a*) and adds encoded data updates to the initial statistics. Thus, the statistics are slowly updated throughout the data. The decoder of the encoder/decoder unit 150 also mirrors the encoder of the encoder/decoder unit 150 by updating the state of the decode of the KV pair data. Thus, each subsequent CW may include only the updated portion of the statistics. In other words, the current state of the data statistics are rectified by passing add/subtract messages. In some examples, the controller 108 may use a filter based on time and/or length to shift the window for adapting the statistics.

As shown in the plurality of codewords 602*a*-602*n*, the first statistics 606*a* are the full statistics. However, at each subsequent CW, the statistics are updated. For example, at the i-th CW 602*i*, i-th statistics 606*i* are the updated statistics of the first statistics 606*a*. Likewise, the j-th statistics 606*j* are the updated statistics of the i-th statistics 606*i*. The nth statistics 606*n* are the updated statistics of the j-th statistics 606*j*.

Figure 7:
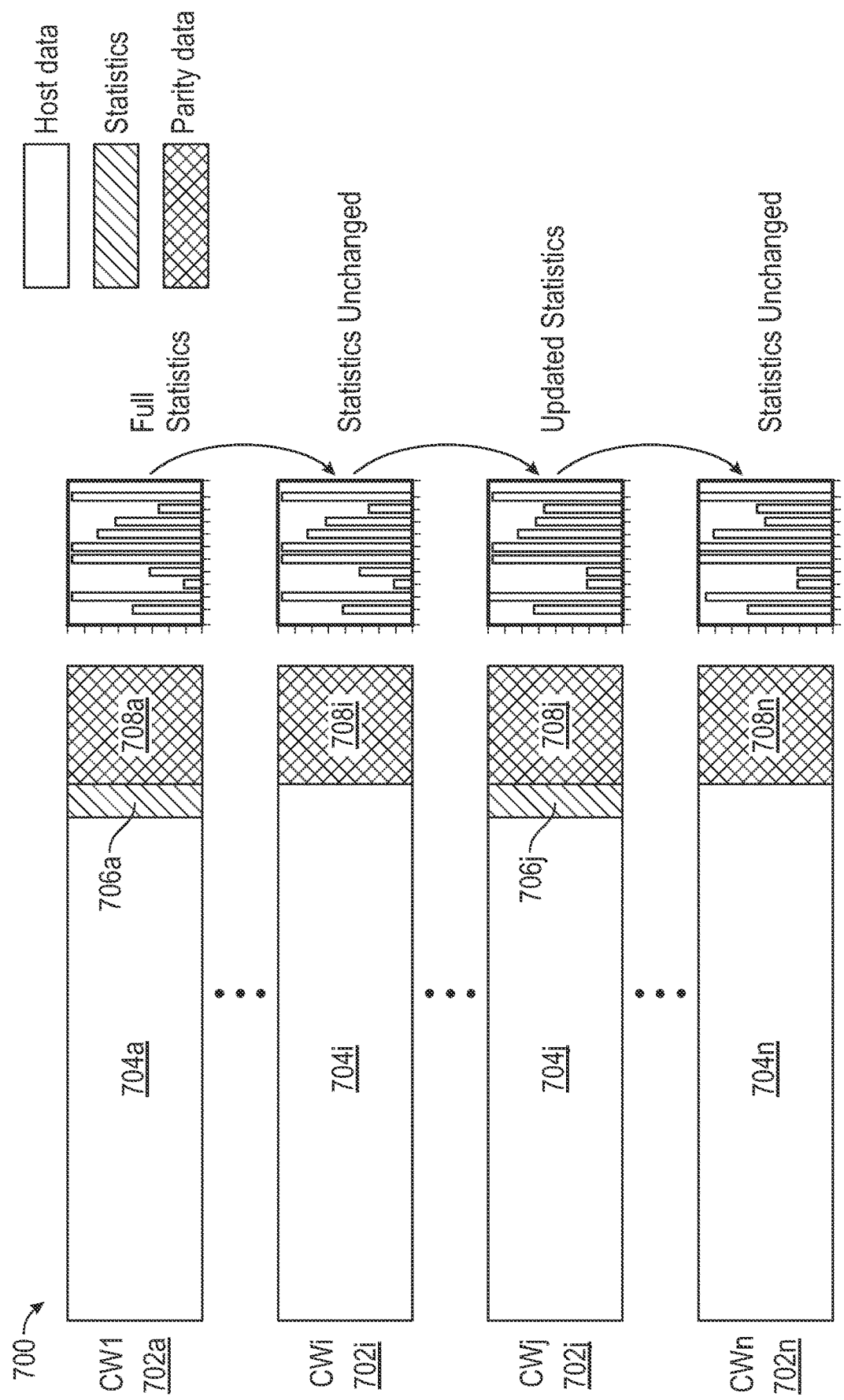
FIG. 7 is an illustration of a plurality of codewords having asynchronous adaptive statistics, according to certain embodiments.

FIG. 7 is an illustration of a plurality of codewords 702*a*-702*n* having asynchronous adaptive statistics, according to certain embodiments. For exemplary purposes, aspects of the storage system 100 may be referenced herein. The plurality of codewords 702*a*-702*n* may be programmed to a memory device, such as the NVM 110. Because the data may be homogenous, updates to the statistics may not be required periodically. In other words, the controller 108 may determine that the statistics are to be updated based on changes to the data or that additional data sufficiently improves the statistics.

The plurality of codewords 702*a*-702*n* includes a first CW 702*a*, an i-th CW 702*i*, a j-th CW 702*j*, and an nth CW 702*n*. The first CW 702*a* includes first host data 704*a*, first statistics 706*a*, and first parity data 708*a*. The i-th CW 702*i* includes i-th host data 704*i* and i-th parity data 708*i*. The j-th CW 702*j* includes j-th host data 704*j*, j-th statistics 706*j*, and j-th parity data 708*j*. The nth CW 702*n* includes nth host data 704*n* and nth parity data 708*n*.

The encoder of the encoder/decoder unit 150 may maintain the current statistics representation encoded to the data and compare the current statistics representation to the actual statistics representation. If the difference between the current statistics and the actual statistics is above a difference threshold, then the encoder of the encoder/decoder unit 150 updates the current statistics with the actual statistics.

The plurality of codewords 702*a*-702*n* illustrates an example in which full statistics (e.g., first statistics 706*a*) were obtained in the first CW 702*a*, remained unchanged until an i-th CW 702*i*, incrementally updated from a subsequent CW from the i-th CW 702*i* to a j-th CW 702*j*, and remained unchanged from a subsequent CW from the j-th CW 702*j* to a nth CW 702*n*. In some examples, the CWs having the unchanged statistics may still include statistics, where the statistics are the same as the previously changed statistics.

Figure 8:
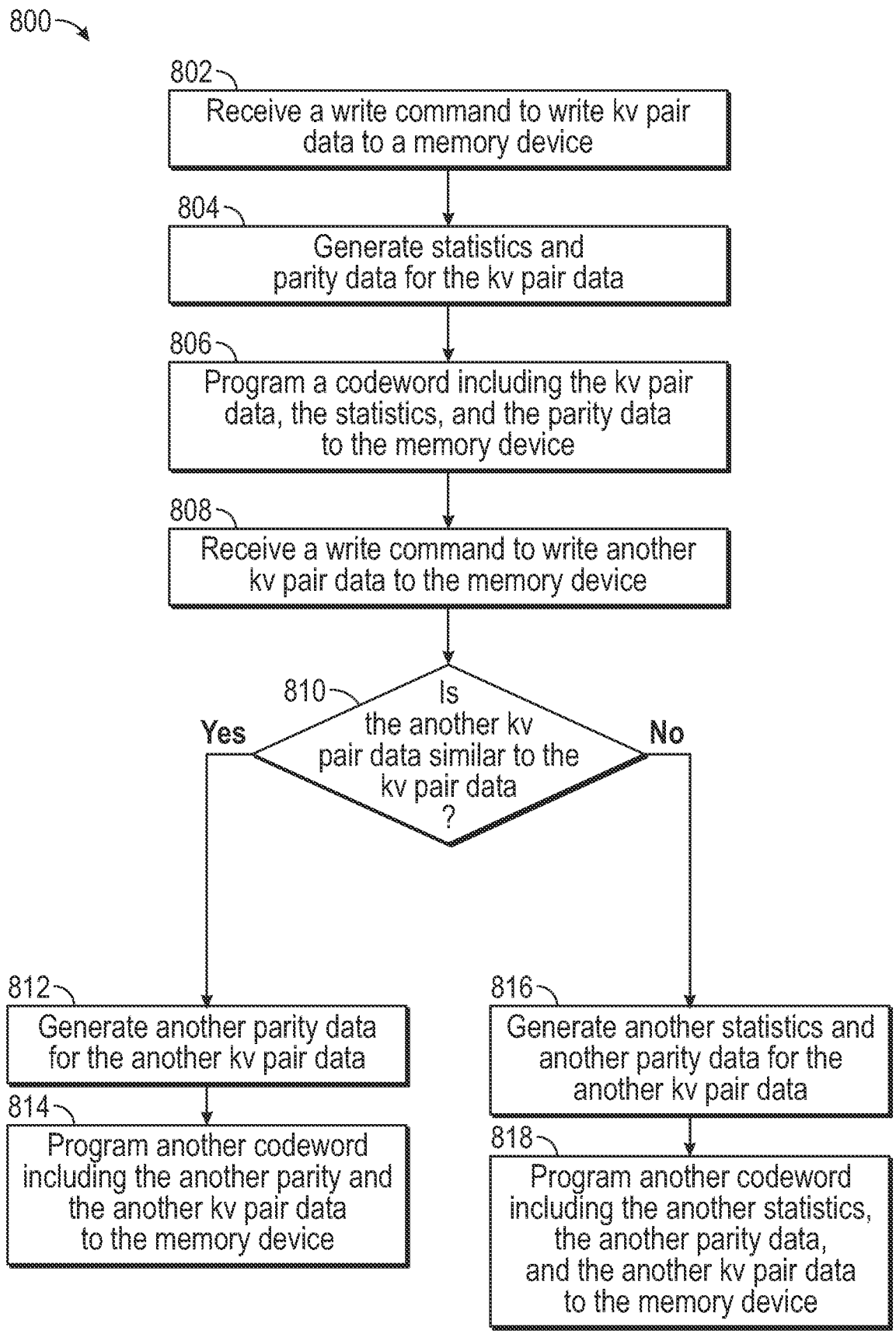
FIG. 8 is a flow diagram illustrating a method of generating a codeword and programming the codeword to a memory device, according to certain embodiments.

FIG. 8 is a flow diagram illustrating a method 800 of generating a codeword and programming the codeword to a memory device, according to certain embodiments. Aspects of the storage system 100 of FIG. 1 may be referenced herein for exemplary purposes. Method 800 may be implemented by the controller 108.

At block 802, the controller 108 receives a write command write KV pair data to a memory device, such as the NVM 110, from a host device 104. At block 804, the controller 108 generates statistics and parity data for the KV pair data. At block 806, the controller 108 programs a codeword that includes the KV pair data, the statistics, and the parity data to the NVM 110. At block 808, the controller 108 receives another write command to write another KV pair data to the NVM 110. It is to be understood that in cases where the KV pair data exceeds a maximum codeword length, the KV pair data may be split into multiple write commands, where the another write command is a subsequent write command to write command received at block 802.

At block 810, the controller 108 determines if the another KV pair data is similar to the KV pair data of block 802. If, at block 810, the another KV pair data is similar to the KV pair data of block 802, then the controller 108 generates another parity data for the another KV pair data 812. At block 814, the controller 108 programs another codeword including the another parity and the another KV pair data to the NVM 110. However, if, at block 810, the another kV pair data is not similar to the KV pair data of block 802, then the controller 108 generates another statistics and another parity data for the another KV pair data at block 816. At block 818, the controller 108 programs another codeword including the another statistics, the another parity data, and the another KV pair data to the NVM 110.

By including statistics in codewords for a KV system, the endurance of the data storage device may be improved, the firmware overhead related to error handling may be decreased, the decoding latency may be improved, and the quality of service may be improved.

In one embodiment, a data storage device includes a memory device and a controller coupled to the memory device. The controller is configured to store a plurality of codewords in the memory device. Each codeword of the plurality of codewords includes host data and parity data corresponding to the host data. Less than all of the plurality of codewords further includes statistics corresponding to the host data.

The statistics are only stored in a first codeword of the plurality of codewords. The statistics are shared for all of the plurality of codewords. First statistics are stored in a first codeword and second statistics are stored in a second codeword. The second statistics is an updated version of the first statistics. A third codeword consists of host data and parity data. First statistics are stored in a first codeword and second statistics are stored in a second codeword. The second statistics consists of changes from the first statistics. The plurality of codewords comprises a first codeword, a second codeword, and a third codeword. The first codeword comprises first statistics, the second codeword does not include statistics, and the third codeword comprises second statistics. The second statistics is an updated version of the first statistics. The updated version consists of changes from the first statistics. The updated version consists of an aggregated statistics. The statistics are updated based on decoding key value (KV) data associated with the host data. The decoding is content aware decoding.

In another embodiment, a data storage device includes a memory device and a controller coupled to the memory device. The controller is configured to program a plurality of codewords to the memory device. The plurality of codewords includes a first codeword, a second codeword, and a third codeword. The first codeword includes first statistics, the second codeword includes second statistics, and the third codeword includes third statistics. The first statistics, the second statistics, and the third statistics are different.

The second statistics consists of changes from the first statistics. The third statistics consists of changes from the second statistics. The third statistics is an updated version of the second statistics. The second statistics is an updated version of the first statistics. The third statistics is an updated version of the second statistics. The third statistics consists of changes from the second statistics.

In another embodiment, a data storage device includes memory means and a controller coupled to the memory means. The controller is configured to program a plurality of codewords to the memory means. Less than all codewords of the plurality of codewords contains statistics corresponding to all of the plurality of codewords.

The statistics are either incremental statistics, adaptive statistics, or both incremental statistics and adaptive statistics. The statistics corresponds with decoded key value (KV) pairs.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a memory device; and
a controller coupled to the memory device, the controller configured to:
store a plurality of codewords in the memory device, wherein each codeword of the plurality of codewords includes host data and parity data corresponding to the host data, and wherein less than all of the plurality of codewords further includes statistics corresponding to the host data.

2. The data storage device of claim 1, wherein statistics are only stored in a first codeword of the plurality of codewords, and wherein the statistics are shared for all of the plurality of codewords.

3. The data storage device of claim 1, wherein first statistics are stored in a first codeword and second statistics are stored in a second codeword, and wherein the second statistics is an updated version of the first statistics.

4. The data storage device of claim 3, wherein a third codeword consists of host data and parity data.

5. The data storage device of claim 1, wherein first statistics are stored in a first codeword and second statistics are stored in a second codeword, and wherein the second statistics consists of changes from the first statistics.

6. The data storage device of claim 1, wherein the plurality of codewords comprises a first codeword, a second codeword, and a third codeword, wherein the first codeword comprises first statistics, the second codeword does not include statistics, and the third codeword comprises second statistics, and wherein the second statistics is an updated version of the first statistics.

7. The data storage device of claim 6, wherein the updated version consists of changes from the first statistics.

8. The data storage device of claim 6, wherein the updated version consists of an aggregated statistics.

9. The data storage device of claim 1, wherein the statistics are updated based on decoding key value (KV) data associated with the host data.

10. The data storage device of claim 9, wherein the decoding is content aware decoding.

11. A data storage device, comprising:
a memory device; and
a controller coupled to the memory device, the controller configured to:
program a plurality of codewords to the memory device, wherein:
the plurality of codewords includes a first codeword, a second codeword, and a third codeword;
the first codeword includes first statistics, the second codeword includes second statistics, and the third codeword includes third statistics; and
the first statistics, the second statistics, and the third statistics are different.

12. The data storage device of claim 11, wherein the second statistics consists of changes from the first statistics.

13. The data storage device of claim 12, wherein the third statistics consists of changes from the second statistics.

14. The data storage device of claim 12, wherein the third statistics is an updated version of the second statistics.

15. The data storage device of claim 11, wherein the second statistics is an updated version of the first statistics.

16. The data storage device of claim 15, wherein the third statistics is an updated version of the second statistics.

17. The data storage device of claim 15, wherein the third statistics consists of changes from the second statistics.

18. A data storage device, comprising:
memory means; and
a controller coupled to the memory means, the controller configured to:
program a plurality of codewords to the memory means, wherein less than all codewords of the plurality of codewords contains statistics corresponding to all of the plurality of codewords.

19. The data storage device of claim 18, wherein the statistics are either incremental statistics, adaptive statistics, or both incremental statistics and adaptive statistics.

20. The data storage device of claim 18, wherein the statistics corresponds with decoded key value (KV) pairs.

* * * * *